United States Patent

Edwards

[15] 3,675,148

[45] July 4, 1972

[54] RANDOM NOISE GENERATOR DIODE WITH IMPEDANCE MATCHED TRANSISTOR AMPLIFIER

[72] Inventor: Lon E. Edwards, Danbury, Conn.

[73] Assignee: Solitron Devices, Inc., Tappan, N.Y.

[22] Filed: June 6, 1969

[21] Appl. No.: 830,939

[52] U.S. Cl. ....................................331/78, 330/25, 330/26

[51] Int. Cl. ......................................................H03b 29/00

[58] Field of Search ................................331/78; 330/26, 25

[56] References Cited

UNITED STATES PATENTS 3,281,711 10/1966 Kees et al. ...............................331/78

OTHER PUBLICATIONS

Edwards, Electronics World, Nov. 1962, pp. 40–42

*Primary Examiner*—Roy Lake
*Assistant Examiner*—Siegfried H. Grimm
*Attorney*—Bernard Malina

[57] ABSTRACT

A random noise generator employs a silicon diode as the active noise source in an amplifier circuit where the output impedance of the noise diode is matched to the input impedance of the amplifier circuit to provide an increased frequency spectrum, temperature stability and increased independence of power supply variations.

6 Claims, 6 Drawing Figures

INVENTOR.
LON E. EDWARDS

BY

Bernard Malina
ATTORNEY

RANDOM NOISE GENERATOR DIODE WITH IMPEDANCE MATCHED TRANSISTOR AMPLIFIER

The present invention relates to electronic random noise generation and more particularly to a solid state broad frequency spectrum noise generator.

Random voltages are generally used as test signals for electronic equipment and in particular to determine its frequency response, stability and power handling capability of amplifiers. Other common uses for random noise voltages are as a basic reference for calibrating both low and high frequency radio receivers, radar systems, and specific radio receiver equipment for analysis of cosmic noise, random stimulation of computers to determine stability; as random sound signals for use in composition of electronic music; for providing source random numbers for statistical use; as signals for use in electronic counter measures; and as signals for use in destructive testing of electronic components.

Noise generator circuits presently in use typically employ temperature-limited diodes, thyratrons and gas discharge tubes as their active noise generating elements. These noise-generating devices require relatively high voltages, such as 100 volts to 2,000 volts to ionize the gas therein to make the gas tube conduct the 1 ma – 10 ma current necessary for generation of a random noise output. In addition to the fact that these presently used gas tubes are inherently bulky, cumbersome, and operate at high temperatures, they require large and heavy power supplies. Furthermore, each of such gas tubes is limited in frequency response, so that a number of tubes are required to generate random noise over a spectrum of such as 0 to 12.6 kilo-mc A further disadvantage of such conventional gas tube noise generators is their lack of sufficient stability over wide ranges of ambient operating temperatures. The aforementioned disabilities of weight and temperature sensitivity are particularly acute in air-borne equipments such as in aircraft, missiles and spacecraft which are employed at high altitudes and/or high operating temperatures. It is therefore an object of the present invention to provide a random-noise generator operative over a very wide frequency range.

It is a further object of the present invention to provide a random noise generator having a high degree of stability over a very wide ambient temperature range, e.g., –60° C. to +125° C.

Yet another object of the present invention is to provide a random noise generator in accordance with the preceding objects, which is compact, rugged and requires very low power consumption for its operation.

In accordance with the principles of the present invention there is provided a random noise generator comprising a semiconductor random noise generating element in circuit with an amplifier circuit means. The amplifier circuit means comprises feedback circuit means which is operative to match the input impedance of the amplifier circuit means to the output impedance of the noise generating element to thereby provide a noise signal output having an increased frequency spectrum, temperature stability and greater independence from power supply variations.

The features of the invention which are believed novel are set forth with particularity in the appended claims. The invention itself, however, both as to is organization and method of operation, together with further objects and features thereof may best be understood with reference to the following description taken in conjunction with the accompanying drawings wherein.

Figure 1:
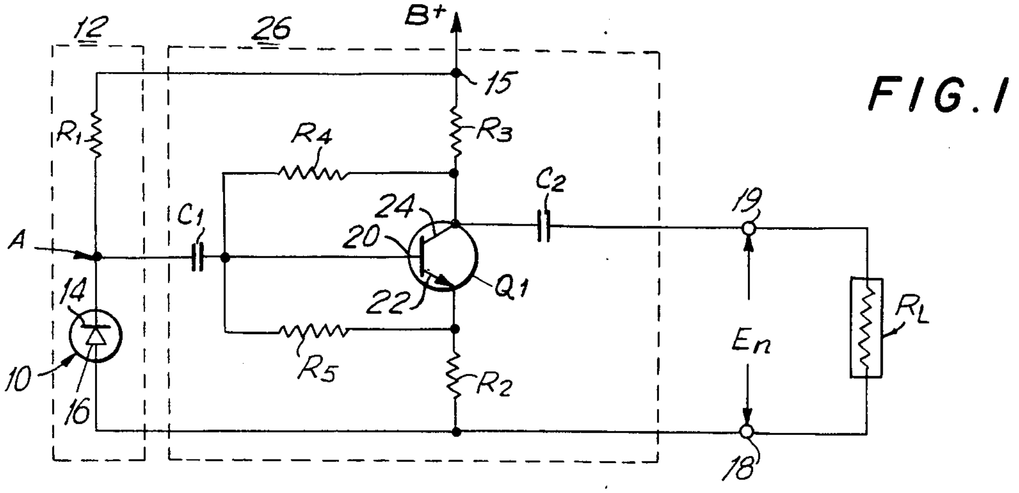
FIG. 1 is a schematic circuit diagram of a preferred embodiment of a noise generator constructed in accordance with the principles of the present invention.

In the preferred embodiment of the present invention as depicted by FIG. 1, the active noise generating element 10 is a noise diode known commercially as a Solitron Sounvistor, which is selected to operate with a +20 volts electrical supply. In operation, diode 10 is reverse-biased into the avalanche mode, in which it generates random noise pulses over a wide frequency spectrum e.g. from about 10Hz to about 16 Mhz at an output amplitude of about 25 to 30 db above KTB, across 50 ohms. Under the stated conditions, device 10 consumes less than 300 milli-watts of power and exhibits a temperature stability of ±2.0 db maximum over a range of –60° C. to +60° C.

Referring now to FIG. 1, the diode 10 is employed as a noise generating element in the circuit shown as follows: The basic noise generating circuit 12 comprises noise diode 10 and a current limiting resistor $R_1$, connected between the +20V supply terminal 15 and the cathode 14 of the diode 10, while the anode 16 is connected to the negative ground terminal of the +20V supply. The generated random noise is obtained at the junction of diode 10 and resistor $R_1$ and is applied to the base 20 of transistor Q1 by means of capacitor $C_1$, which is interconnected therebetween. The emitter 22 of transistor $Q_1$ is connected to ground terminal 18 through resistor $R_2$ while the collector 24 is connected to the +20v supply terminal 14 through resistor $R_3$. Furthermore, resistor $R_4$ is provided between base 20 and collector 24 and another resistor $R_5$ is connected between the base 20 and emitter 22. Resistors $R_4$ and $R_5$ are operative to provide suitable DC bias at base 20 of transistor $Q_1$ and a shunt-feedback path to stabilize both the DC bias and the AC random noise signal. This feedback can be used to control both the input and output impedance of amplifier circuit 26 and stabilizes its current gain so that it is less dependent on the characteristics of the specific transistor $Q_1$. This feature permits amplifier circuit 26 to be used as an iterative amplifier. It has been found that improved stability and frequency response of amplifier circuit 26 results by connecting one end of resistor $R_5$ to emitter 22 of transistor $Q_1$ as shown, rather than directly to ground terminal 18 as conventionally practiced. It is believed that this improved stability and frequency response is due to the interaction of the input signal at base 20 and the amplified signal in the emitter resistor $R_2$. By advantagous selection of transistor $Q_1$ and resistors $R_2$, $R_3$, $Q_4$ and $R_5$ a value of input impedance for amplifier circuit 26 is obtained which suitably matches the output impedance of noise diode 10 to thereby provide an improved temperature stability for the entire noise generator. Furthermore, for optimum frequency shaping, capacitor $C_1$ is selected so that its capacitive reactance operates between the output impedance of diode 10 and the input impedance of transistor $Q_1$ so as to provide a rise in output with increase in frequency amplitude up to frequency $f_1$ (100 Kc), with the output then remaining constant with further increases in frequency. Transistor $G_1$ can be selected so that its internal capacitances provide a roll-off above frequency $f_2$ (500 KHz) in combination with the output load RL of 3K ohms. In this way a band-pass filter of the desired characteristics results. Finally, the amplifying action of transistor $Q_1$ in combination with its associated components is operative to increase the noise level at junction A from 25–30 db above KTB at 50 ohms to 5–6 millivolts over the bandwidth of 100 KHz to 500 KHz across the load $R_1$ (3 kilohms), which is connected across output terminals 18 and 19. Typical values of the circuit components of Fig. 1 in one embodiment are as follows:

EXAMPLE I

| | | |
|---|---|---|
| Diode 10 | | Solitron Sounvisto |
| | $C_1$ | 1000 pf ceramic |
| | $C_2$ | 1 mfd tantalum (125°C) |
| | $R_1$ | 12K ohm ⅛ w |

| | |
|---|---|
| $R_4$ | 680K ohm ⅛ w |
| $R_3$ | 15K ohm ⅛ w |
| $R_5$ | 56K ohm ⅛ w |
| $R_2$ | 10K ohm ⅛ w |
| $R_L$ | 3K ohm ¼ w |
| B+ | +20 V |

| | |
|---|---|
| Frequency Response | 100KHz–500 KHz ± 1.0 db with approximately 3.0 db roll-off above and below the specified band limits. |
| $E_N$ | 4.0 to 6.0 millivolts true RMS |
| Operating Temperature | −60°C to +60°C ± 1.5 db from 25°C |

Figure 2A:
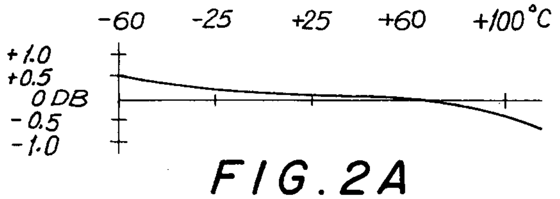
Fig. 2A is a graphical depiction of the temperature stability of the noise diode alone.
Figure 2B:
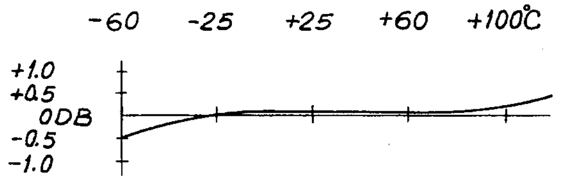
FIG. 2B is a graphical depiction of the temperature stability of the amplifier circuit of the present invention alone.
Figure 2C:
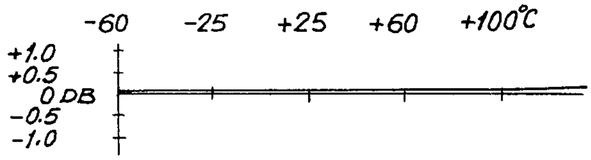
FIG. 2C is a graphical depiction of the temperature stability of the noise generator of the present invention comprising the combination of the noise diode and the amplifier circuit of the present invention.

Referring to the drawings, FIGS. 2A to 2C depict the improvement in temperature stability obtained by means of the present invention as herein described. In Fig. 2A it is seen that the temperature response of diode 10 is such that its random noise output increases at very low temperatures and falls at very high temperatures. In Fig. 2B the temperature response of amplifier circuit 26 is the converse of the temperature response of diode 10. Fig. 2C illustrates the effect of matching transistor $Q_1$ to the diode 10 as herein described.

Figure 3A:
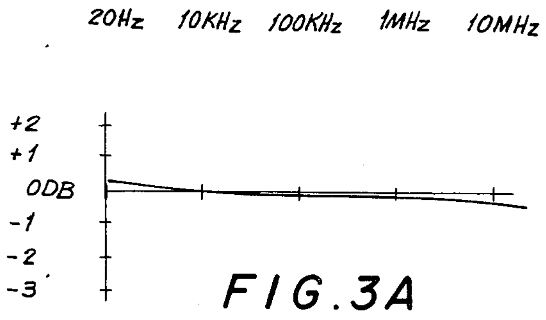
FIG. 3A is a graphical depiction of the frequency response of the noise diode alone i.e. aside from the amplifier circuit of the present invention.
Figure 3B:
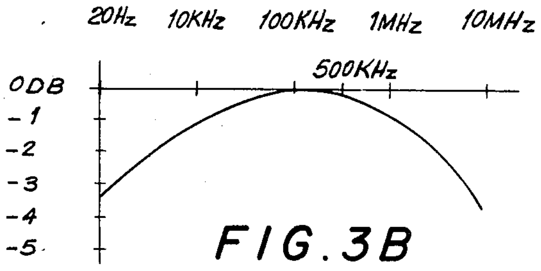
FIG. 3B is a graphical depiction of the frequency response of the noise generator of FIG. 1, i.e. the combination of the noise diode and the amplifier circuit of the present invention.

Figs. 3A to 3B illustrate how frequency shaping affects the response of diode 10. Thus, FIG. 3A shows the response of diode 10 to be flat within ±0.5 db up to 10 MHz, whereas FIG. 3B shows how the band pass character of circuit 26 has decreased both the low frequencies and the high frequencies outside the band pass limits of 100 KHz and 500 KHz respectively.

In practice, all of the circuit components of FIG. 1 comprising the noise generator of the present invention, (excepting $R_L$), are packed in a molded module dimensioned about three-fourths inch long, one-half inch wide, and seven-sixteenths inch high, and fitted with three wire terminals to be used in conventional printed circuit board construction.

The results obtained by the noise generator of the present invention as exemplified by FIGS. 2A to 2C and 3A and 3B provide a distinct improvement over presently known noise generator circuits. By way of example, typical results of amplifier circuits used in conjunction with conventional noise diodes are set forth in *Transistor Circuit Design*, by Engineering Staff, Texas Instruments, Inc. pgs. 197–205, McGraw Hill, 1963. It is apparent in comparing the temperature stability of such presently known amplifiers with the results of FIG. 2B, that a marked improvement is obtained by employing the configuration depicted in FIG. 1.

The above-mentioned presently known amplifiers utilize a two resistor voltage divider circuit having its opposite ends connected across the terminals of the supply voltage with the junction connected to the base of the transistor. This two resistor-divider arrangement results in a rather wide variation in base bias when the supply voltage changes, as it does in many applications, particularly airborne ones. On the other hand, in the configuration of FIG. 1, biasing is achieved by the opposite ends of resistors $R_4$ and $R_5$ being connected to the collector and emitter respectively, rather than across the supply terminals. In this configuration, $R_4$ and $R_5$ provide DC current feedback to give increased stabilization of the base bias with changes in supply voltage.

The circuit configuration of FIG. 1 in Example 1 above, provides a random noise signal which is flat (±1.0 db) over a spectrum of 100 KHz to 500 KHz. It is understood, however, that a wider frequency spectrum may be obtained by the circuit configuration of FIG. 1 by selecting a transistor $Q_1$ with higher $F_T$ (gain-bandwidth product) and choosing appropriate values for the associated resistor and capacitor components. Thus, for a desired frequency range of 1 MHz to 100 MHz a transistor, having an $F_T$ of 2,000 MHz, the following circuit components would obtain.

EXAMPLE II

| | |
|---|---|
| $C_1$ | .01 mfd |
| $C_2$ | .02 mfd |
| $R_1$ | 12K ohm |
| $R_4$ | 4.7K ohm |
| $R_3$ | 120 ohm |
| $R_5$ | 4.7K ohm |
| $R_2$ | 22 ohms |
| B+ | +15V |

| | |
|---|---|
| Frequency Response | 1 MHz–100 MHz ±2.0 db |
| $E_N$ | 1.0 MV across 50 ohms true RMS |
| Operating Temperature | 40°C to +75°C ± 2.5 db |

While there have been shown particular embodiments of the present invention it will be understood that it is not wished to be limited thereto, since modifications can be made in the circuit arrangements and values of components therein of the noise generator of the present invention, and it is contemplated in the appended claims to cover any such modifications as fall within the true spirit and scope of this invention.

I claim:

1. A random noise generator comprising a semiconductor random noise generating element and amplifier circuit means including a transistor in circuit with said noise generating element, said amplifier circuit means including feedback means operative to match the input impedance of said amplifier circuit means to the output impedance of said noise generating element, said feedback means comprising a first feedback circuit connected between the collector and base electrodes of said transistor.

2. A noise generator as defined in claim 1 wherein said feedback means further comprises a second feedback circuit connected between the base and emitter terminals, said first and second feedback circuits being operative to provide a d.c. bias voltage for said base and shunt feedback paths from the collector to the base and from the base to the emitter of said transistor to thereby control the input impedance of said amplifier circuit means and render the gain thereof independent of variations in supply voltage to said noise generator.

3. A noise generator as defined in claim 2 wherein said first feedback circuit comprises a resistor.

4. A noise generator as defined in claim 3 wherein said second feedback circuit comprises a resistor.

5. A noise generator as defined in claim 2 wherein the Beta current gain lies between about 150 – 400 for collector currents in the range of about 10 microamps to 1 milliamp respectively.

6. A noise generator as defined in claim 4 wherein the resistance values of said resistors are such as to produce a collector current of about centrally within the range of 10 microamps and 1 milliamp.

* * * * *